United States Patent
Cheng et al.

(10) Patent No.: US 9,633,972 B2
(45) Date of Patent: Apr. 25, 2017

(54) METHOD FOR MANUFACTURING SEMICONDUCTOR DISPLAY PANEL

(71) Applicants: Jun Cheng, Beijing (CN); Min Yan, Beijing (CN); Mingbo Zhou, Beijing (CN)

(72) Inventors: Jun Cheng, Beijing (CN); Min Yan, Beijing (CN); Mingbo Zhou, Beijing (CN)

( * ) Notice: Subject to any disclaimer, the term of this patent is extended or adjusted under 35 U.S.C. 154(b) by 0 days.

(21) Appl. No.: 14/903,934

(22) PCT Filed: May 6, 2014

(86) PCT No.: PCT/CN2014/076842
§ 371 (c)(1),
(2) Date: Apr. 14, 2016

(87) PCT Pub. No.: WO2015/003525
PCT Pub. Date: Jan. 15, 2015

(65) Prior Publication Data
US 2016/0225740 A1    Aug. 4, 2016

(30) Foreign Application Priority Data
Jul. 9, 2013    (CN) .......................... 2013 1 0286869

(51) Int. Cl.
*H01L 25/04*    (2014.01)
*H01L 21/50*    (2006.01)
(Continued)

(52) U.S. Cl.
CPC ............ *H01L 25/042* (2013.01); *H01L 21/50* (2013.01); *H01L 22/12* (2013.01); *H01L 22/14* (2013.01);
(Continued)

(58) Field of Classification Search
None
See application file for complete search history.

(56) References Cited

U.S. PATENT DOCUMENTS

| 2010/0203707 | A1 | 8/2010 | Fujii et al. |
| 2016/0087179 | A1* | 3/2016 | Tischler ................. H01L 21/78 438/27 |

FOREIGN PATENT DOCUMENTS

| CN | 1728342 A | 2/2006 |
| CN | 101350160 A | 1/2009 |

(Continued)

OTHER PUBLICATIONS

International Search Report (PCT/ISA/210) issued on Jul. 15, 2014, by the Chinese Patent Office as the International Searching Authority for International Application No. PCT/CN2014/076842.
(Continued)

*Primary Examiner* — Asok K Sarkar
(74) *Attorney, Agent, or Firm* — Buchanan Ingersoll & Rooney PC

(57) ABSTRACT

A manufacturing method includes: attaching a film onto a bonding surface of a wafer; performing laser cutting on the wafer to obtain a plurality of semiconductor light-emitting eutectic chips; attaching light-emitting surfaces of the plurality of eutectic chips on to an expansion film; detaching films from bonding surfaces of the plurality of eutectic chips; performing wafer expansion on the expansion film so that the plurality of eutectic chips have the same intervals as chip loading spaces on a substrate; attaching the expansion film onto a tray, and moving the tray so that positions of the plurality of eutectic chips correspond to that of the chip loading spaces; moving the tray so that the plurality of eutectic chips approach the chip loading spaces on the substrate; and embedding the plurality of eutectic chips into
(Continued)

the chip loading spaces so that the plurality of eutectic chips are electrically connected to the substrate.

8 Claims, 4 Drawing Sheets

(51) Int. Cl.

| | |
|---|---|
| *H01L 21/66* | (2006.01) |
| *H01L 25/03* | (2006.01) |
| *H01L 25/075* | (2006.01) |
| *H01L 33/00* | (2010.01) |
| *H01L 23/00* | (2006.01) |
| *H01L 33/62* | (2010.01) |
| *H01L 25/00* | (2006.01) |

(52) U.S. Cl.
CPC .............. *H01L 22/22* (2013.01); *H01L 24/95* (2013.01); *H01L 25/03* (2013.01); *H01L 25/0753* (2013.01); *H01L 33/0095* (2013.01); *H01L 33/62* (2013.01); *H01L 25/50* (2013.01); *H01L 2924/01322* (2013.01); *H01L 2924/10158* (2013.01); *H01L 2933/0066* (2013.01)

(56) References Cited

FOREIGN PATENT DOCUMENTS

| | | |
|---|---|---|
| CN | 101471407 A | 7/2009 |
| CN | 103400779 A | 11/2013 |
| TW | 201042720 A | 12/2010 |

OTHER PUBLICATIONS

Written Opinion (PCT/ISA/237) issued on Jul. 15, 2014, by the Chinese Patent Office as the International Searching Authority for International Application No. PCT/CN2014/076842.

* cited by examiner

METHOD FOR MANUFACTURING SEMICONDUCTOR DISPLAY PANEL

TECHNICAL FIELD

This application claims priority from the Chinese patent application No. 201310286869.2 filed before State Intellectual Property Office of China on Jul. 9, 2013 titled as "Manufacturing method for semiconductor display panel", which is incorporated herewith by reference.

The present invention relates to the technical field of semiconductors, in particular to a manufacturing method for a semiconductor display panel consisting of DA (Direct Attach) semiconductor light-emitting eutectic chips.

BACKGROUND

Conventional mounting and bonding processes are usually employed to manufacture conventional semiconductor displays. For example, a die on a wafer is expanded by use of an expansion film after silver colloid is prepared on bottom electrodes of an LED (Light Emitting Diode) die; the expanded wafer is placed on a chip ejecting platform; dies are mounted on a PCB (Printed Circuit Board) or a bonding pad corresponding to an LED support one by one by use of a chip ejecting pen or an automatic chip drawing system under a microscope; sintering is performed to cure the silver colloid; and electrodes are connected to the LED die by use of an aluminum wire bonder or a gold wire bonder as leads for power supply.

The above manufacturing method has the defects of complex operation, long manufacturing time and incapability of carrying out manufacture when resolution of a semiconductor display is increased to a certain degree (e.g., when pixel pitch is required to be smaller than 1 MM).

SUMMARY OF THE INVENTION

The present invention aims to provide a manufacturing method for a semiconductor display panel, which can overcome the above defects.

The present invention provides a manufacturing method for a semiconductor display panel, comprising the following steps of: attaching a film onto a bonding surface of a wafer provided with a plurality of semiconductor light-emitting eutectic chips;

performing laser cutting on the wafer to obtain a plurality of semiconductor light-emitting eutectic chips attached on the film;

attaching light-emitting surfaces of the plurality of semiconductor light-emitting eutectic chips on to an expansion film;

detaching films from bonding surfaces of the plurality of semiconductor light-emitting eutectic chips;

performing wafer expansion on the expansion film in such a manner that the plurality of semiconductor light-emitting eutectic chips have the same intervals as chip loading spaces on a substrate;

attaching the expansion film subjected to the wafer expansion onto a tray of a surface mounting device, and moving to position the tray in such a manner that positions of the plurality of semiconductor light-emitting eutectic chips are corresponding to that of the chip loading spaces;

moving the tray step by step in such a manner that the plurality of semiconductor light-emitting eutectic chips subjected to the wafer expansion approach the chip loading spaces on the substrate step by step; and embedding the plurality of semiconductor light-emitting eutectic chips into the chip loading spaces in such a manner that the plurality of semiconductor light-emitting eutectic chips are electrically connected to the substrate by means of an adhesive.

Preferably, the step of moving the tray step by step in such a manner that the plurality of semiconductor light-emitting eutectic chips subjected to the wafer expansion approach the chip loading spaces on the substrate step by step specifically comprises the following steps of:

aligning the plurality of semiconductor light-emitting eutectic chips subjected to the wafer expansion with the chip loading spaces on the substrate by means of laser; and moving the tray step by step and performing the laser alignment again when the distance between the plurality of semiconductor light-emitting eutectic chips and the chip loading spaces on the substrate are narrowed by a prescribed distance.

Preferably, before the step of moving the tray step by step in such a manner that the plurality of semiconductor light-emitting eutectic chips subjected to the wafer expansion approach the chip loading spaces on the substrate step by step, the manufacturing method for a semiconductor display panel further comprises the following step of:

dispensing the adhesive on the chip loading spaces at positions corresponding to bonding pads of the semiconductor light-emitting eutectic chips embedded into the chip loading spaces.

Further preferably, the adhesive is silver colloid.

Preferably, the step of embedding the plurality of semiconductor light-emitting eutectic chips into the chip loading spaces in such a manner that the plurality of semiconductor light-emitting eutectic chips are electrically connected to the substrate by means of an adhesive specifically comprises the steps of: embedding the plurality of semiconductor light-emitting eutectic chips into corresponding chip loading spaces by pushing and pulling the tray step by step and exerting a force on the plurality of semiconductor light-emitting eutectic chips by means of the tray in such a manner that the chips are electrically connected to the substrate by means of the adhesive.

Preferably, the plurality of semiconductor light-emitting eutectic chips are specifically selected from any one of a group consisting of: a red LED eutectic chip, a green LED eutectic chip and a blue LED eutectic chip.

Preferably, after the step of embedding the plurality of semiconductor light-emitting eutectic chips into the chip loading spaces in such a manner that the plurality of semiconductor light-emitting eutectic chips are electrically connected to the substrate by means of an adhesive, the manufacturing method for a semiconductor display panel further comprises the following steps of:

removing the expansion film from the plurality of semiconductor light-emitting eutectic chips;

and cleaning surfaces of the plurality of semiconductor light-emitting eutectic chips subjected to the expansion film removal.

Further preferably, after the step of cleaning surfaces of the plurality of semiconductor light-emitting eutectic chips subjected to the expansion film removal, the manufacturing method for a semiconductor display panel further comprises the following step of:

detecting electrical performances of the substrate where the plurality of semiconductor light-emitting eutectic chips are embedded.

According to the manufacturing method for a semiconductor display panel provided by the present invention, an LED flip-chip process and a secondary film attachment process are employed. The plurality of semiconductor light-emitting eutectic chips subjected to wafer expansion are directly embedded into corresponding chip loading spaces on the substrate of the semiconductor display panel, and the embedment of light-emitting chips of the same color is completed at one time without any bonding wire. Therefore, the manufacturing method for a semiconductor display panel provided by the present invention has the advantages of simplicity and stability in process, and is particularly applicable to manufacturing high-resolution semiconductor display panels, which require small chip intervals.

DESCRIPTION OF THE EMBODIMENTS

Technical solutions of the present invention will be described in detail as follows in connection with the drawings and embodiments.

Figure 1:
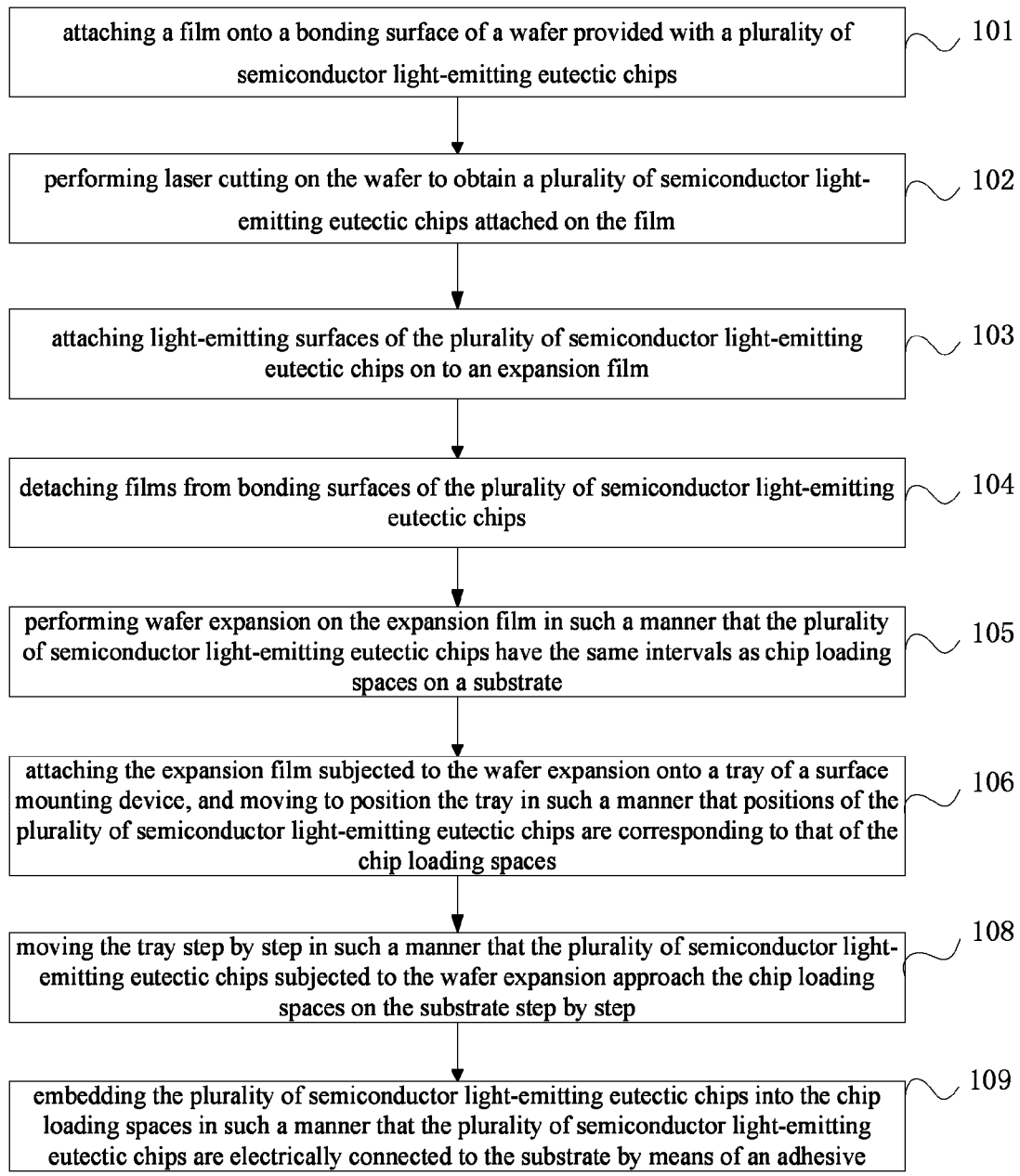
FIG. 1 is a flow chart of a manufacturing method for a semiconductor display panel provided by an embodiment of the present invention.
Figure 2:
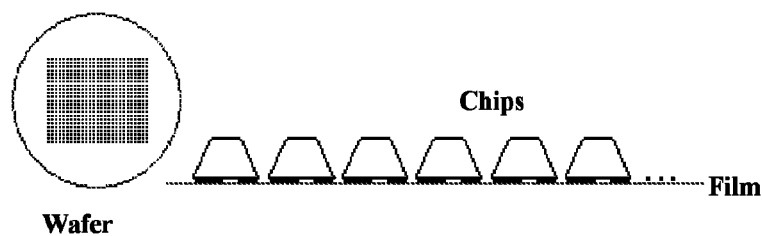
FIG. 2 is a schematic diagram I for manufacturing steps of a semiconductor display panel provided by an embodiment of the present invention.
Figure 3:
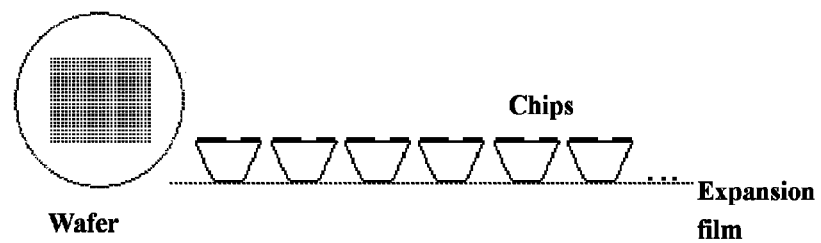
FIG. 3 is a schematic diagram II for manufacturing steps of a semiconductor display panel provided by an embodiment of the present invention.
Figure 4:
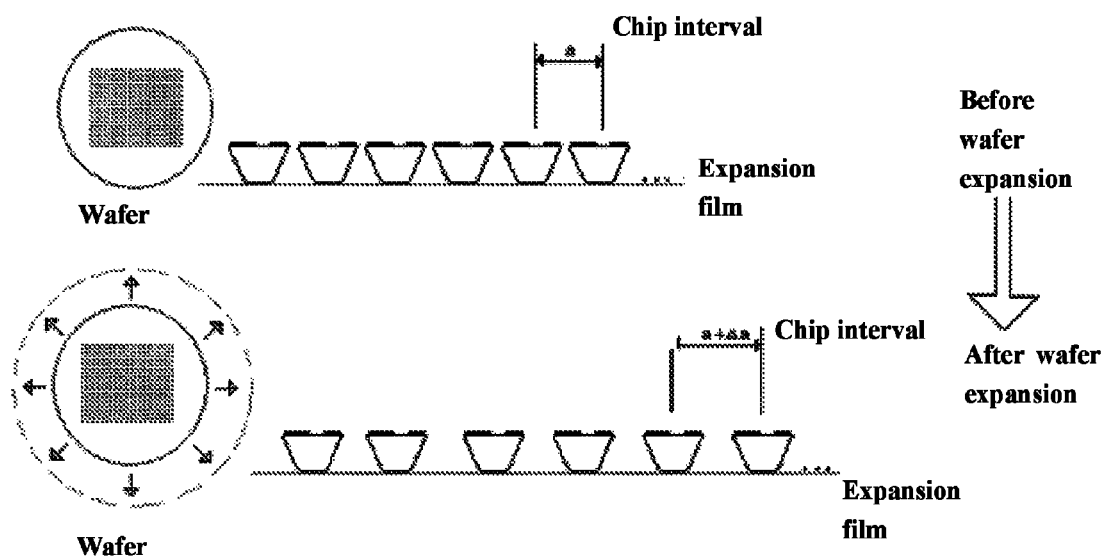
FIG. 4 is a schematic diagram III for manufacturing steps of a semiconductor display panel provided by an embodiment of the present invention.
Figure 5:
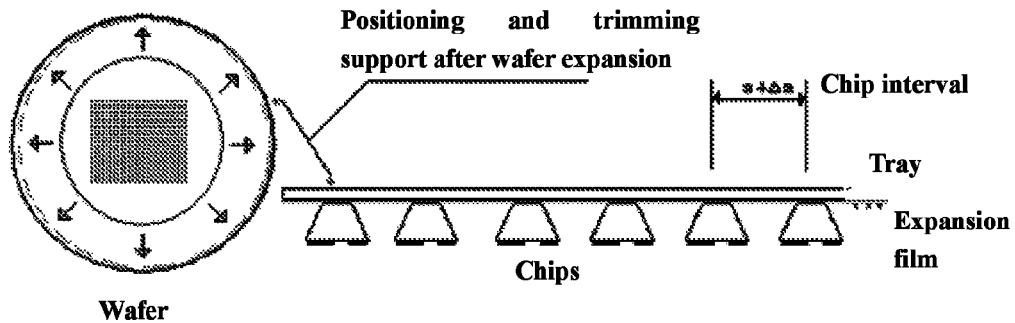
FIG. 5 is a schematic diagram IV for manufacturing steps of a semiconductor display panel provided by an embodiment of the present invention.
Figure 6:
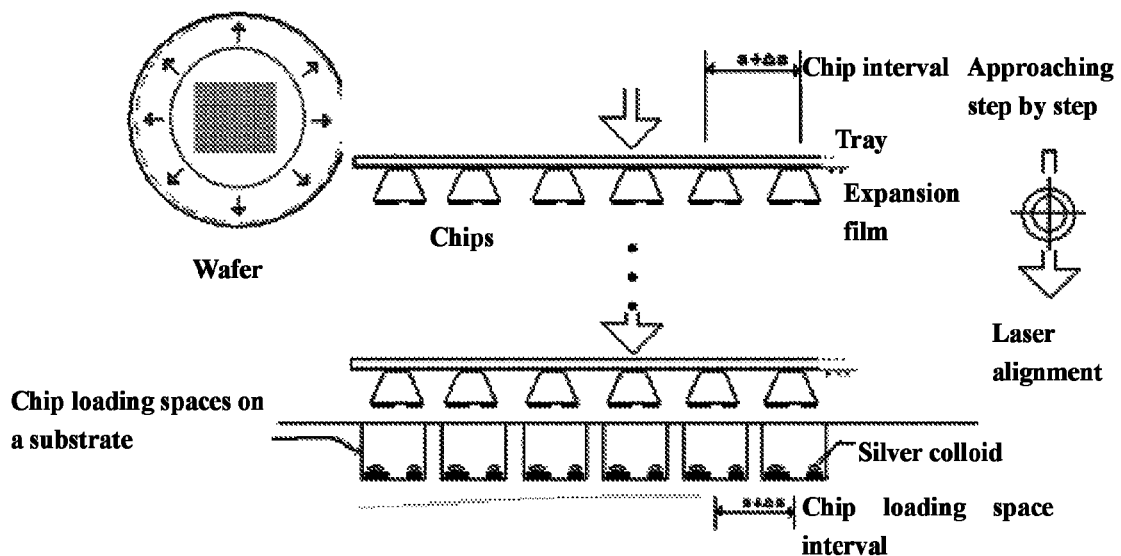
FIG. 6 is a schematic diagram V for manufacturing steps of a semiconductor display panel provided by an embodiment of the present invention.

FIG. 1 is a flow chart of a manufacturing method for a semiconductor display panel provided by an embodiment of the present invention. The manufacturing method of the present invention comprises the following:

step 101 of attaching a film onto a bonding surface of a wafer provided with a plurality of semiconductor light-emitting eutectic chips;

specifically, as shown in FIG. 2, attaching a film onto a metal bonding pad surface of a wafer in such a manner that out-light surfaces of the wafer face upward, wherein, in FIG. 2, FIG. 3, FIG. 4, FIG. 5 and FIG. 6, the diagram on the left is a top view and the diagram on the right is a side view;

step 102 of performing laser cutting on the wafer to obtain a plurality of semiconductor light-emitting eutectic chips attached on the film;

step 103 of attaching light-emitting surfaces of the plurality of semiconductor light-emitting eutectic chips on to an expansion film;

specifically, performing secondary film attachment on the chips; specifically, attaching an expansion film on light-emitting surfaces of the chips;

step 104 of detaching films from bonding surfaces of the plurality of semiconductor light-emitting eutectic chips;

specifically, detaching films from bonding surfaces of the chips so as to expose electrodes of the chips, wherein the diagram after the films are detached from the bonding surfaces of the chips is as shown in FIG. 3;

step 105 of performing wafer expansion on the expansion film in such a manner that the plurality of semiconductor light-emitting eutectic chips have the same intervals as chip loading spaces on a substrate;

specifically, as shown in FIG. 4, positions of the chips and intervals between the chips are not changed in the previous steps, while, in step 105, increasing and decreasing dimensions of the expansion film are controlled accurately by means of a special wafer expander in such a manner that original intervals a of the chips are expanded to intervals a+Δa; preferably, the chips subjected to the wafer expansion have intervals of more than 0.4 mm;

step 106 of attaching the expansion film subjected to the wafer expansion onto a tray of a surface mounting device, and moving to position the tray in such a manner that positions of the plurality of semiconductor light-emitting eutectic chips are corresponding to that of the chip loading spaces;

specifically, as shown in FIG. 5, the expansion film has a double-sided adhesive characteristic, and therefore the expansion film subjected to the wafer expansion can be attached to the tray of the surface mounting device so as to ensure the flatness between the chips;

the tray for supporting the chips is moved to position, so that the plurality of semiconductor light-emitting eutectic chips are corresponding to the chip loading spaces on the substrate one by one in position;

step 108 of moving the tray step by step in such a manner that the plurality of semiconductor light-emitting eutectic chips subjected to the wafer expansion approach the chip loading spaces on the substrate step by step;

specifically, as shown in FIG. 5, aligning the plurality of semiconductor light-emitting eutectic chips subjected to the wafer expansion with the chip loading spaces on the substrate by means of laser; and moving the tray step by step and performing the laser alignment again when the distance between the plurality of semiconductor light-emitting eutectic chips and the chip loading spaces on the substrate are narrowed by a prescribed distance;

step 109 of embedding the plurality of semiconductor light-emitting eutectic chips into the chip loading spaces in such a manner that the plurality of semiconductor light-emitting eutectic chips are electrically connected to the substrate by means of an adhesive;

specifically, as shown in FIG. 6, embedding the plurality of semiconductor light-emitting eutectic chips into corresponding chip loading spaces at one time by pushing and pulling the tray step by step, and exerting a force on the plurality of semiconductor light-emitting eutectic chips by means of the tray in such a manner that the chips are electrically connected to the substrate by means of the adhesive;

step 110 of removing the expansion film from the plurality of semiconductor light-emitting eutectic chips; and cleaning surfaces of the plurality of semiconductor light-emitting eutectic chips subjected to the expansion film removal.

Preferably, before step 108, the manufacturing method of the present invention further comprises the following:

step 107 of dispensing the adhesive on the chip loading spaces at positions corresponding to bonding pads of the semiconductor light-emitting eutectic chips embedded into the chip loading spaces.

Specifically, the adhesive is silver colloid or other conductive adhesives, which can make effect at room temperature.

In one example, the plurality of semiconductor light-emitting eutectic chips on the semiconductor display panel are specifically red LED eutectic chips, green LED eutectic chips and blue LED eutectic chips, which are all DA eutectic chips.

The plurality of semiconductor light-emitting eutectic chips on a first wafer are red LED eutectic chips. After the red LED eutectic chips are embedded into the chip loading spaces according to the method of steps 101-110 and are electrically connected to the substrate by means of the adhesive, green LED eutectic chips on a wafer provided with the green LED eutectic chips and blue LED eutectic chips on an another wafer provided with the blue LED eutectic chips are embedded into the chip loading spaces according to the same method of steps 101-110.

Figure 7:
FIG. 7 is a schematic diagram VI for manufacturing steps of a semiconductor display panel provided by an embodiment of the present invention.
Figure 8:
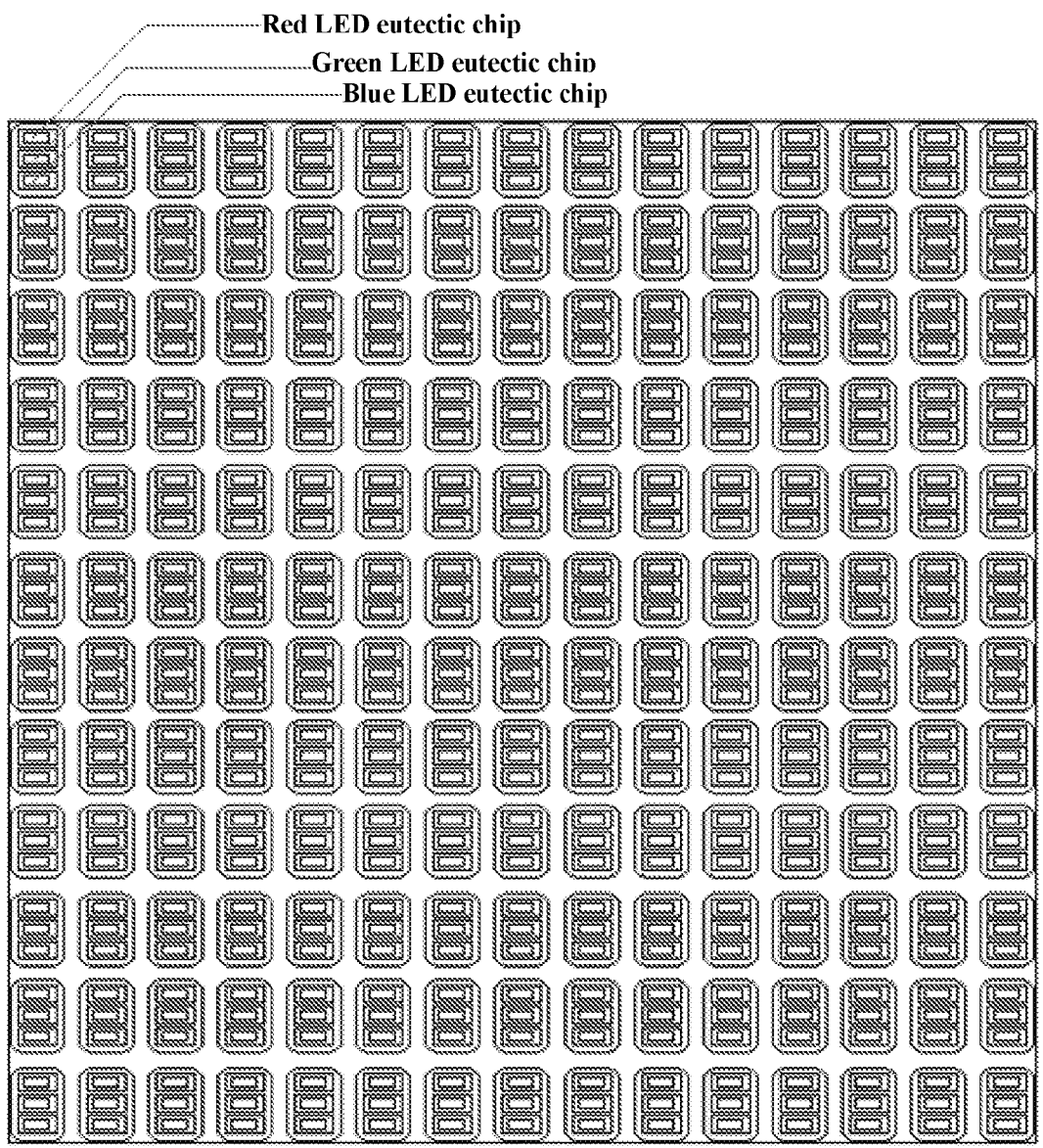
FIG. 8 is a schematic diagram of a semiconductor display panel manufactured by a manufacturing method for a semiconductor display panel provided by an embodiment of the present invention.

After all the chip loading spaces on the substrate are embedded by corresponding semiconductor light-emitting eutectic chips, the semiconductor display panel is as shown in FIG. 7. The substrate where the plurality of embedded semiconductor light-emitting eutectic chips are embedded is subjected to electrical detection, followed by a detection that whether photoelectric parameters and out-light uniformity of the semiconductor display panel meet requirements.

The method provided by the embodiments of the present invention is applicable to manufacturing semiconductor LED display panels with chip intervals of 0.4 mm or more. According to the method, an LED flip-chip process and a secondary film attachment process are employed, the plurality of semiconductor light-emitting eutectic chips subjected to wafer expansion are directly embedded into corresponding chip loading spaces on the substrate of the semiconductor display panel, and the embedment of light-emitting chips of the same color is completed at one time without any bonding wire. Therefore, the manufacturing method for a semiconductor display panel provided by the present invention has the advantages of simplicity and stability in process, and is particularly applicable to manufacturing high-resolution semiconductor display panels, which require small chip intervals.

In the forgoing embodiments, objects, technical details and beneficial effects of the present invention are further described in detail. It should be understood that the foregoing embodiments merely are exemplary embodiments of the invention, and not intended to define the scope of the invention. Any amendment, equivalent replacement, improvement and so on based on the spirit and principle of the present invention should be within the scope of the invention.

What is claimed is:

1. A manufacturing method for a semiconductor display panel, comprising:
    attaching a first film onto a bonding surface of a wafer provided with a plurality of semiconductor light-emitting eutectic chips having electrodes;
    performing laser cutting on the wafer to obtain a plurality of semiconductor light-emitting eutectic chips attached on the first film;
    attaching light-emitting surfaces of the plurality of semiconductor light-emitting eutectic chips on to a side of an expansion film;
    detaching the first film from the plurality of semiconductor light-emitting eutectic chips to expose the electrodes of the chips;
    performing expansion of the expansion film in such a manner that the plurality of semiconductor light-emitting eutectic chips have a same interval between them as chip loading spaces on a substrate;
    attaching the other side of the expansion film subjected to the expansion onto a tray of a surface mounting device, and moving to position the tray in such a manner that positions of the plurality of semiconductor light-emitting eutectic chips are corresponding to that of the chip loading spaces;
    moving the tray step by step in such a manner that the plurality of semiconductor light-emitting eutectic chips subjected to the expansion approach the chip loading spaces on the substrate step by step; and
    embedding the plurality of semiconductor light-emitting eutectic chips simultaneously into the chip loading spaces in such a manner that the plurality of semiconductor light-emitting eutectic chips are electrically connected to the substrate by means of an adhesive.

2. The manufacturing method for a semiconductor display panel according to claim 1, wherein:
    the step of moving the tray step by step in such a manner that the plurality of semiconductor light-emitting eutectic chips subjected to the expansion approach the chip loading spaces on the substrate step by step specifically comprises the following steps of:
    aligning the plurality of semiconductor light-emitting eutectic chips subjected to the wafer expansion with the chip loading spaces on the substrate by means of a laser; and
    moving the tray step by step and performing laser alignment again when the distance between the plurality of semiconductor light-emitting eutectic chips and the chip loading spaces on the substrate are narrowed by a prescribed distance.

3. The manufacturing method for a semiconductor display panel according to claim 1, wherein, before the step of moving the tray step by step in such a manner that the plurality of semiconductor light-emitting eutectic chips subjected to the wafer expansion approach the chip loading spaces on the substrate step by step, further comprising the following step of:
    dispensing the adhesive on the chip loading spaces at positions corresponding to bonding pads of the semiconductor light-emitting eutectic chips embedded into the chip loading spaces.

4. The manufacturing method for a semiconductor display panel according to claim 3, wherein:
    the adhesive is silver colloid.

5. The manufacturing method for a semiconductor display panel according to claim 1, wherein:
    the step of embedding the plurality of semiconductor light-emitting eutectic chips into the chip loading spaces in such a manner that the plurality of semiconductor light-emitting eutectic chips are electrically connected to the substrate by means of an adhesive specifically comprises the steps of:
    embedding the plurality of semiconductor light-emitting eutectic chips into corresponding chip loading spaces by pushing and pulling the tray step by step and exerting a force on the plurality of semiconductor light-emitting eutectic chips by means of the tray in such a manner that the chips are electrically connected to the substrate by means of the adhesive.

6. The manufacturing method for a semiconductor display panel according to claim 1, wherein:
   the plurality of semiconductor light-emitting eutectic chips are specifically selected from any one of a group consisting of:
   a red LED eutectic chip, a green LED eutectic chip and a blue LED eutectic chip.

7. The manufacturing method for a semiconductor display panel according to claim 1, wherein, after the step of embedding the plurality of semiconductor light-emitting eutectic chips into the chip loading spaces in such a manner that the plurality of semiconductor light-emitting eutectic chips are electrically connected to the substrate by means of an adhesive, further comprising the following steps of:
   removing the expansion film from the plurality of semiconductor light-emitting eutectic chips; and
   cleaning surfaces of the plurality of semiconductor light-emitting eutectic chips subjected to the expansion film removal.

8. The manufacturing method for a semiconductor display panel according to claim 7, wherein, after the step of cleaning surfaces of the plurality of semiconductor light-emitting eutectic chips subjected to the expansion film removal, further comprising the following step of:
   detecting electrical performances of the substrate where the plurality of semiconductor light-emitting eutectic chips are embedded.

* * * * *